United States Patent
Horiuchi

(10) Patent No.: US 9,222,838 B2
(45) Date of Patent: Dec. 29, 2015

(54) DETECTION DEVICE, SENSOR DEVICE, AND ELECTRONIC DEVICE

(75) Inventor: Hiroshi Horiuchi, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 716 days.

(21) Appl. No.: 13/013,011

(22) Filed: Jan. 25, 2011

(65) Prior Publication Data

US 2011/0182323 A1 Jul. 28, 2011

(30) Foreign Application Priority Data

Jan. 26, 2010 (JP) ................................. 2010-014135
Nov. 22, 2010 (JP) ................................. 2010-260001

(51) Int. Cl.

| | |
|---|---|
| *G01R 31/02* | (2006.01) |
| *G01R 31/26* | (2014.01) |
| *G01N 25/00* | (2006.01) |
| *G01J 5/34* | (2006.01) |
| *G01J 5/22* | (2006.01) |
| *G01K 7/00* | (2006.01) |
| *H01L 37/02* | (2006.01) |
| *B41M 5/26* | (2006.01) |
| *H01G 7/02* | (2006.01) |

(52) U.S. Cl.
CPC .... *G01J 5/34* (2013.01); *G01J 5/22* (2013.01); *B41M 5/26* (2013.01); *G01K 7/003* (2013.01); *H01G 7/023* (2013.01); *H01L 37/02* (2013.01)

(58) Field of Classification Search
CPC ........... G01K 7/003; G01J 5/34; H01L 37/02; H01G 7/023; B41M 5/36
USPC .............................. 324/762.09; 374/E72.002
See application file for complete search history.

(56) References Cited

U.S. PATENT DOCUMENTS

| 4,897,547 | A | | 1/1990 | Iwasa et al. |
| 5,043,820 | A | * | 8/1991 | Wyles et al. ................... 348/300 |
| 5,144,133 | A | * | 9/1992 | Dudley et al. ............... 250/208.1 |
| 5,729,285 | A | * | 3/1998 | Peterson et al. .............. 348/300 |
| 5,869,857 | A | | 2/1999 | Chen |
| 5,926,217 | A | * | 7/1999 | Peterson et al. .............. 348/301 |
| 6,313,462 | B1 | * | 11/2001 | Matsuda et al. ........... 250/208.1 |
| 2003/0047671 | A1 | * | 3/2003 | Hironaka et al. ............. 250/221 |
| 2009/0033687 | A1 | * | 2/2009 | Kasai et al. .................... 345/690 |

FOREIGN PATENT DOCUMENTS

| JP | 59-142427 A | 8/1984 |
| JP | 01-102321 A | 4/1989 |

(Continued)

OTHER PUBLICATIONS

The extended European Search Report for European Application No. 11151983.1 mailed Aug. 29, 2013.

*Primary Examiner* — Patrick Assouad
*Assistant Examiner* — Hoang X Nguyen
(74) *Attorney, Agent, or Firm* — Global IP Counselors, LLP

(57) ABSTRACT

A detection device includes a heat sensing element, a detection circuit connected to a detection node of the heat sensing element, and a read circuit connected to a read node of the detection circuit, wherein the detection circuit includes a drive transistor whose gate is controlled by the detection node. In a program period the detection node is programmed to a voltage value corresponding to the threshold voltage of the drive transistor, and in a read period following the program period the read circuit reads the detection result of the detection circuit.

15 Claims, 14 Drawing Sheets

(56) References Cited

FOREIGN PATENT DOCUMENTS

| JP | 06-265411 A | 9/1994 |
| JP | 06-265411 A | 9/1994 |
| JP | 11-274463 A | 10/1999 |
| JP | 2009-017432 A | 1/2009 |
| JP | 2009-089292 A | 4/2009 |
| JP | 2010-097042 A | 4/2010 |

* cited by examiner

DETECTION DEVICE, SENSOR DEVICE, AND ELECTRONIC DEVICE

CROSS-REFERENCE TO RELATED APPLICATIONS

This application claims priority to Japanese Patent Application No. 2010-014135 filed on Jan. 26, 2010 and Japanese Patent Application No. 2010-260001 filed on Nov. 22, 2010. The entire disclosures of Japanese Patent Application Nos. 2010-014135 and 2010-260001 are hereby incorporated herein by reference.

BACKGROUND

1. Technical Field

The present invention relates to a detection device, a sensor cell, an electronic device, etc.

2. Related Art

Circuits that make use of pyroelectric elements for detecting infrared rays have been known in the past. For example, infrared rays with a wavelength of about 10 μm are radiated from the human body, and temperature information or the presence of a body can be acquired in non-contact fashion by detecting this radiation. Therefore, intrusion detection or physical amount measurement can be accomplished by utilizing an infrared detection circuit such as this. Also, if an infrared camera equipped with an FPA (focal plane array) is used, this makes possible night-vision devices that detect and display the forms of people and so forth at night when driving a vehicle, thermographic devices used for influenza quarantines and the like, and so on.

The technology disclosed in Japanese Laid-Open Patent Application S59-142427 and Japanese Laid-Open Patent Application H6-265411, for example, is known as prior art in the field of infrared detection circuits. With the prior art in Japanese Laid-Open Patent Application S59-142427, for instance, pyroelectric current from a pyroelectric element is read while using a chopper to repeatedly shine and block infrared rays on and from the pyroelectric element.

With the prior art in Japanese Laid-Open Patent Application H6-265411, for instance, a method is employed in which pulse voltage is applied to a pyroelectric element. Specifically, the amount of spontaneous polarization, etc., of a pyroelectric element brought about by a ferroelectric changes with the temperature of the pyroelectric element, attributable to the infrared rays directed at the pyroelectric element. In view of this, the amount of incident infrared rays can be measured by measuring the surface charge of the pyroelectric element, which varies according to the spontaneous polarization, etc.

SUMMARY

With the above cases of prior art, however, a problem is that there is inevitable variance in the output voltage caused by variance in the characteristics of the transistors used in the detection circuit, making it difficult to improve detection accuracy.

The several aspects of the present invention provide a detection device, a sensor device, an electronic device, and so forth with high detection accuracy.

One aspect of the present invention comprises a heat sensing element, a detection circuit configured to detect the voltage of a detection node that is a node of one end of the heat sensing element, and a read circuit connected to a read node of the detection circuit, wherein the detection circuit includes a drive transistor whose gate is controlled by the detection node, in a program period the detection node is programmed to a voltage value corresponding to the threshold voltage of the drive transistor, and in a read period following the program period the read circuit reads the detection result of the detection circuit.

With one aspect of the present invention, the voltage of the detection node in the program period can be set to a voltage value corresponding to a threshold voltage of the drive transistor. Doing this eliminates the effect of variance in the threshold voltage of the drive transistor. As a result, variance in output signal voltage caused by variance in transistor characteristics can be reduced, so it is possible to increase the detection accuracy of a detection device, for example.

Also, with one aspect of the present invention, the detection circuit includes a programming transistor provided between the detection node and the drain of the drive transistor, and the programming transistor is in its on state in the program period and in its off state in the read period.

In this case, because the programming transistor is in its on state in the program period, the voltage rises between the gate and source of the drive transistor, the parasitic capacitance between the gate and source is charged up to a value corresponding to the threshold voltage, and this voltage value is maintained by the parasitic capacitance. Meanwhile, because the programming transistor is in its off state in the read period, parasitic capacitance between the gate and source is charged by pyroelectric current, and the voltage between the source and gate of the drive transistor further rises from a value corresponding to the threshold voltage. As a result, it is possible to reduce the effect of variance in the threshold voltage of the drive transistor, for example.

Also, with one aspect of the present invention, the read node is a source node of the drive transistor, and the read circuit reads the voltage of the source node of the drive transistor.

In this case, pyroelectric current changes the potential of the gate of the drive transistor, the change in gate potential changes the drain current of the drive transistor, and the change in drain current changes the potential of the source node, so the read circuit can read the voltage change according to the pyroelectric current.

Also, one aspect of the present invention may include a compensation circuit that is provided between the read node and a first power supply node and that compensates for variance in the current supply capability of the drive transistor.

In this case, variance in the output signal voltage caused by variance in transistor mobility, temperature, or the like can be reduced, so it is possible to improve the detection accuracy of a detection device, for example.

Also, with one aspect of the present invention, the compensation circuit includes a resistance element or transistor that is provided between the read node and the first power supply node.

In this case, when the current supply capability of the drive transistor is high, the potential of the read node rises and the voltage between the drain and source of the drive transistor decreases, which reduces the drain current. When the current supply capability of the drive transistor is low, the potential of the read node decreases and the voltage between the drain and source of the drive transistor rises, which increases the drain current. Doing this makes it possible to compensate for variance in the current supply capability of the transistor.

Also, with one aspect of the present invention, the detection circuit includes a switching transistor that is provided between the detection node and the gate of the drive transistor, and a resetting transistor that is provided between the first power supply node and the detection node, the switching transistor is in its off state in the program period and in its on state in the read period, and the resetting transistor is in its on state in the program period and in its off state in the read period.

In this case, since in the program period the detection node is electrically connected to the first power supply node by the resetting transistor, no voltage is applied to the heat sensing element. In the read period, on the other hand, the detection node is electrically connected to the gate of the drive transistor by the switching transistor, so pyroelectric current changes the voltage between the gate and source of the drive transistor. Doing this makes it possible to improve detection accuracy because programming can be performed without applying voltage to the heat sensing element.

Also, with one aspect of the present invention, the read circuit includes a current path transistor that is provided between the first power supply node and the read node, and the current path transistor is in its on state in the program period and in its off state in the read period.

In this case, in the program period drain current is sent from the drive transistor to the current path transistor, the potential of the read node rises, and the voltage between the gate and source of the drive transistor is set to a value corresponding to a threshold voltage. Maintaining this voltage value by the parasitic capacitance between the gate and source makes it possible to program a threshold voltage.

Another aspect of the present invention relates to a sensor device comprising a sensor array having a plurality of sensor cells, one or more row lines, one or more column lines, a row selection circuit connected to the one or more row lines, and a read circuit connected to the one or more column lines, wherein each of the plurality of sensor cells includes a heat sensing element and a detection circuit configured to detect the voltage of a detection node that is a node of one end of the heat sensing element, the detection circuit includes a drive transistor whose gate is controlled by the detection node, in a program period, the detection node is programmed to a voltage value corresponding to the threshold voltage of the drive transistor, and in a read period following the program period, the read circuit reads the detection result of the detection circuit connected to each of the one or more column lines.

With another aspect of the present invention, the voltage of the detection node in the program period can be set to a voltage value corresponding to the threshold voltage of the drive transistor. Doing this eliminates the effect of variance in the threshold voltage of the drive transistor. As a result, variance in the output signal voltage between sensor cells caused by variance in transistor characteristics and so forth can be reduced, so it is possible to increase the detection accuracy of a detection device, for example.

Another aspect of the present invention relates to an electronic device that includes the detection device discussed above.

Another aspect of the present invention relates to an electronic device that includes the sensor device discussed above.

BRIEF DESCRIPTION OF THE DRAWINGS

Referring now to the attached drawings which form a part of this original disclosure.

DETAILED DESCRIPTION OF EXEMPLARY EMBODIMENTS

Preferred embodiments of the present invention will now be described in detail. The embodiments described below are not intended to inappropriately limit the content of the present invention as set forth in the Claims, and not all of the components described in these embodiments are necessarily essential as the solution means of the present invention.

1. Detection Method

With the detection device of this embodiment, a heat sensing element (pyroelectric element, infrared detection element, thermal photodetection element, ferroelectric element) is used as an element for detecting infrared rays and the like. A pyroelectric element, which is an example of a heat sensing element, is an element that makes use of lead zirconate titanate (PZT) or another such ferroelectric, for example, and detects infrared rays by utilizing the fact that the amount of spontaneous polarization of a ferroelectric varies with the temperature. Methods for detecting infrared rays with a pyroelectric element include pyroelectric current detection, polarization detection, and dielectric constant detection. Pyroelectric current detection and polarization detection are used with the detection device of this embodiment. The principles behind pyroelectric current detection and polarization detection will now be described.

Figure 1A:
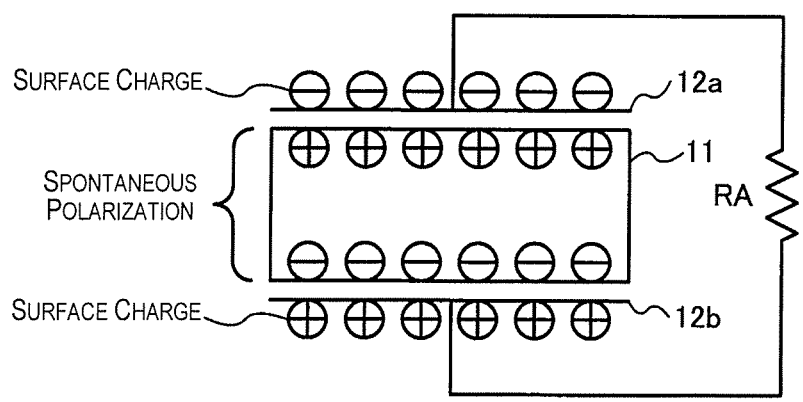
FIGS. 1A and 1B illustrate infrared detection by pyroelectric current detection.
Figure 1B:
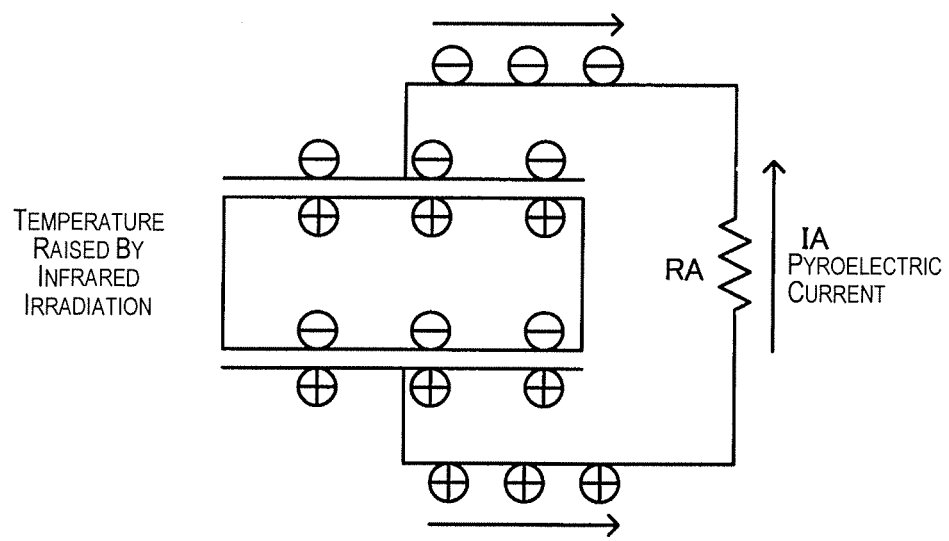

FIGS. 1A and 1B illustrate infrared detection by the pyroelectric current detection method. A pyroelectric element 10 (more broadly, a heat sensing element) includes a pyroelectric 11 (ferroelectric) and electrodes 12 (12a and 12b). FIG. 1A shows the surface charge produced in the electrodes 12a and 12b and the spontaneous polarization of the pyroelectric 11 in an initial state. In this initial state, no infrared rays are being directed at the pyroelectric element 10. Also, the initial state is electrically neutral, that is, the amount of spontaneous polarization and the surface charge are in equilibrium, and the charges do not move. Therefore, no current flows to a resistance element RA.

FIG. 1B shows a state in which infrared rays are directed at the pyroelectric element 10, which raises the temperature of the pyroelectric element 10. When the temperature of the pyroelectric element 10 rises, the amount of spontaneous polarization of the pyroelectric 11 decreases. As a result, equilibrium is lost between the amount of spontaneous polarization and the surface charge, so part of the surface charge moves as shown in FIG. 1B. This movement of the surface charge causes pyroelectric current IA to flow to the resistance element RA. The greater is the temperature change of the pyroelectric element 10, the greater is the pyroelectric current IA, so the temperature of an infrared ray source can be measured by detecting the pyroelectric current IA. This pyroelectric current is produced in the period when the temperature of the pyroelectric element 10 is changing, but in the period when the temperature of the pyroelectric element 10 is steady, no pyroelectric current is produced because the spontaneous polarization and surface charge are in equilibrium. Therefore, with a pyroelectric current detection method, the temperature of a pyroelectric element is changed to generate pyroelectric current by using a chopper or the like to periodically block off the infrared rays emitted by the pyroelectric element.

Figure 2A:
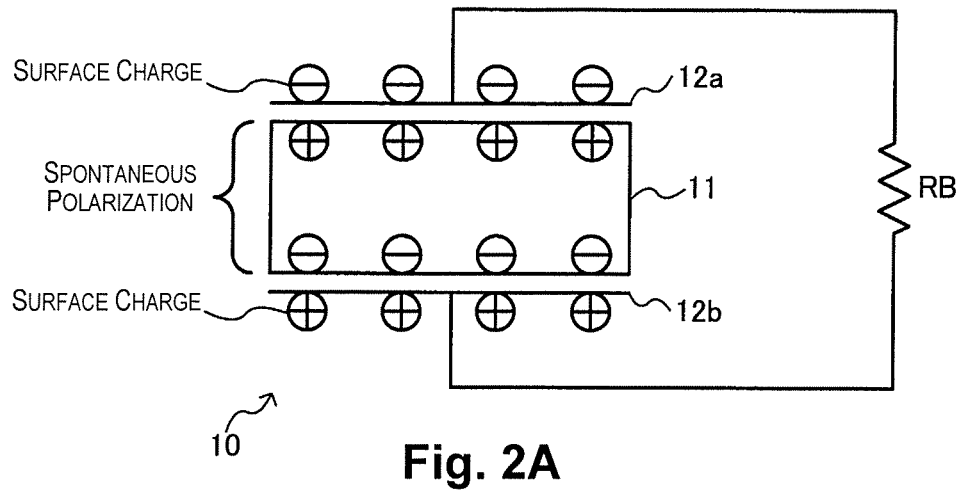
FIGS. 2A to 2C illustrate infrared detection by polarization detection.
Figure 2B:
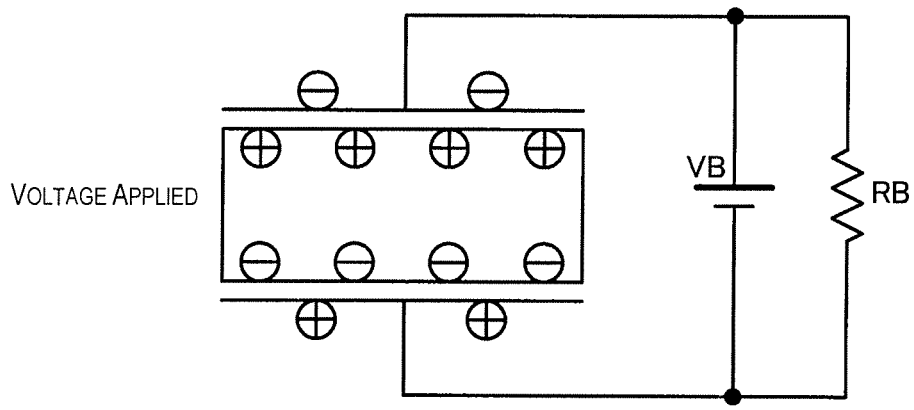
Figure 2C:
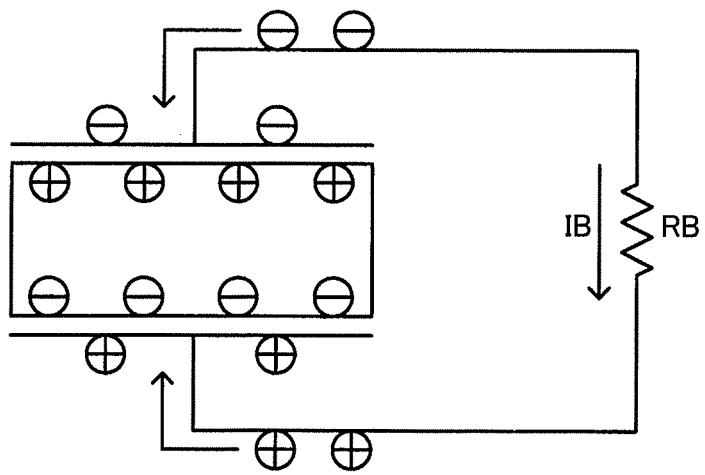

FIGS. 2A to 2C illustrate infrared detection by a polarization detection method. FIG. 2A shows the surface charge produced in the electrodes 12a and 12b and the spontaneous polarization of the pyroelectric 11 in an initial state. This initial state is electrically neutral, that is, the amount of spontaneous polarization and the surface charge are in equilibrium, and the charges do not move. Therefore, no current flows to a resistance element RB. Then, as shown in FIG. 2B, a voltage VB is applied to the pyroelectric element 10. The application of the voltage VB causes part of the surface charge to be eliminated, so the state of equilibrium between the amount of spontaneous polarization and the surface charge is lost.

Then, as shown in FIG. 2C, the voltage source is removed, whereupon the charges move so that equilibrium is restored between the amount of spontaneous polarization and the surface charge, and as a result a current IB is produced. The value of the current IB is a function of the amount of spontaneous polarization of the pyroelectric 11 if the applied voltage VB is constant, and the amount of spontaneous polarization is a function of the temperature of the pyroelectric 11. Therefore, infrared rays can be detected, and the temperature of the infrared ray source can be measured, by detecting this current IB.

As described above, with the detection device of this embodiment, a heat sensing element (pyroelectric element) is used as the element for detecting infrared rays, etc. Either pyroelectric current detection or polarization detection can be used as the method with the detection device of this embodiment.

2. Detection Device

Figure 3:
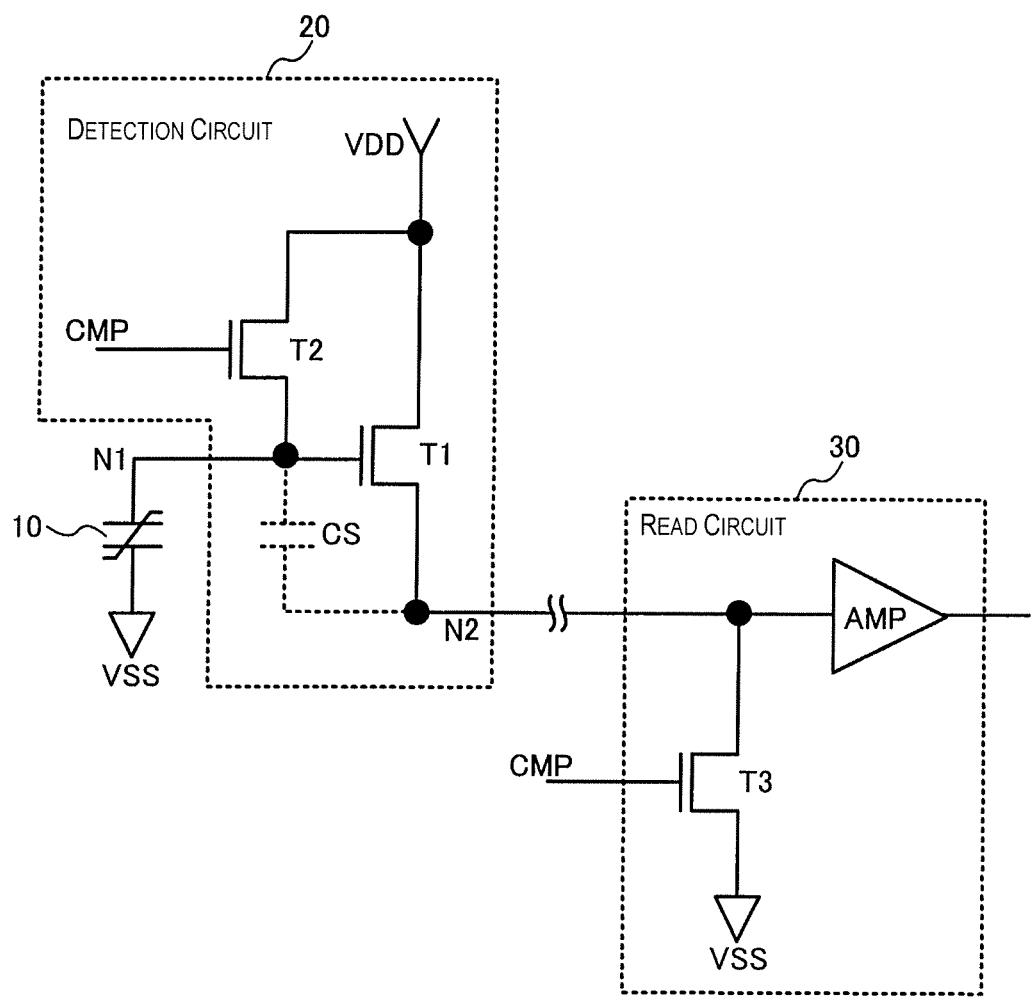
FIG. 3 is a first configuration example of a detection device.

FIG. 3 is a first configuration example of the detection device (infrared detection device) of this embodiment. This first configuration example is a device for detecting infrared rays by the above-mentioned pyroelectric current detection method, and includes the pyroelectric element 10, a detection circuit 20 that detects the voltage of a detection node N1 (a node at one end of the pyroelectric element 10), and a read circuit 30 connected to a read node N2 of the detection circuit 20. The detection device in this embodiment is not limited to the configuration shown in FIG. 3, and various modifications are possible, such as omitting some of the constituent elements, replacing with other constituent elements, or adding other constituent elements. For instance, transistors T1 to T3 need not be N-type transistors, and P-type transistors may be used instead.

The pyroelectric element 10 (heat sensing element, infrared detection element, thermal photodetection element, ferroelectric element) is constituted by a pyroelectric (pyroelectric film) and first and second electrodes provided at both ends so as to sandwich the pyroelectric. The pyroelectric is formed by a film of a ferroelectric such as PZT (lead zirconate titanate), for example, and generates spontaneous polarization. This spontaneous polarization decreases as the temperature rises, so a pyroelectric current accompanies a temperature change in the pyroelectric element as mentioned above.

The detection circuit 20 includes a drive transistor T1 whose gate is controlled by the detection node N1, and a programming transistor T2 provided between the detection node N1 and the drain of the drive transistor T1. The gate of the programming transistor T2 is controlled by a control signal CMP, and is in its on state in a program period TP and is in its off state in a read period TR.

The read node N2 is a source node of the drive transistor T1. The read circuit 30 reads the voltage of the source node of the drive transistor T1.

The read circuit 30 includes a current path transistor T3 provided between the read node N2 and a low potential-side power supply node VSS (more broadly, a first power supply node). The current path transistor T3 is in its on state in the program period TP and in its off state in the read period TR.

The operation of the first configuration example will now be described. In the program period TP, the detection node N1 is programmed to a voltage value corresponding to the threshold voltage of the drive transistor T1. In the read period TR that follows the program period TP, the read circuit 30 reads the detection result of the detection circuit 20.

More specifically, in the program period TP, the control signal CMP is at an H level (high potential level), and the programming transistor T2 and current path transistor T3 are in their on state. When T2 is switched on, the potential rises at the detection node N1, that is, at the gate to the drive transistor T1. A rise in the potential at the gate to T1 causes T1 to enter its on state and causes drain current to flow to T1 and T3. As a result, the voltage applied to parasitic capacitance CS between the source and gate of T1 is a value corresponding to the threshold voltage of T1, and this voltage value is maintained by the charge of the parasitic capacitance CS. Specifically, a voltage value corresponding to the threshold voltage of T1 is programmed. A voltage maintaining capacitor may also be provided between the gate and source of T1 in addition to the parasitic capacitance CS. In this program period TP, infrared rays are blocked off by an incident light control mechanism (not shown; also called an incident light control member or chopper), and the temperature of the pyroelectric element 10 does not change. In the following description, a chopper will be used as an example of the incident light control mechanism.

Meanwhile, in the read period TR, the control signal CMP is at an L level (low potential level), and the programming transistor T2 and current path transistor T3 are in their off state. Also, in the read period TR, infrared rays are directed at the pyroelectric element 10, and as a result the temperature of the pyroelectric element 10 rises and a pyroelectric current is produced. This pyroelectric current charges the parasitic capacitance CS between the gate and source of T1, and the potential of the detection node N1 rises further above the programmed voltage (the voltage value corresponding to the threshold voltage of T1). When the potential of the detection node N1 becomes higher than the threshold voltage of T1, a drain current occurs at T1, and as a result the potential of the read node N2 rises. This voltage change is amplified by an amplifier AMP included in the read circuit 30.

As described above, since the potential of the detection node N1 in the program period TP is set to a voltage value corresponding to the threshold voltage of the drive transistor T1, even if there is variance in the threshold voltage of T1, the effect of that variance can be eliminated. With a sensor array, in which a plurality of sensor cells are laid out in an array, for example, variance in the threshold voltage of the transistor included in the detection circuit of each sensor cell may create variance in the output signal voltage that is read, even though the temperature of the infrared source is the same. With the detection device in this embodiment, variance in the output signal voltage caused by variance in the threshold voltage of the transistors included in the detection circuit can be reduced. As a result, it is possible to raise the detection accuracy of the detection device.

Figure 4:
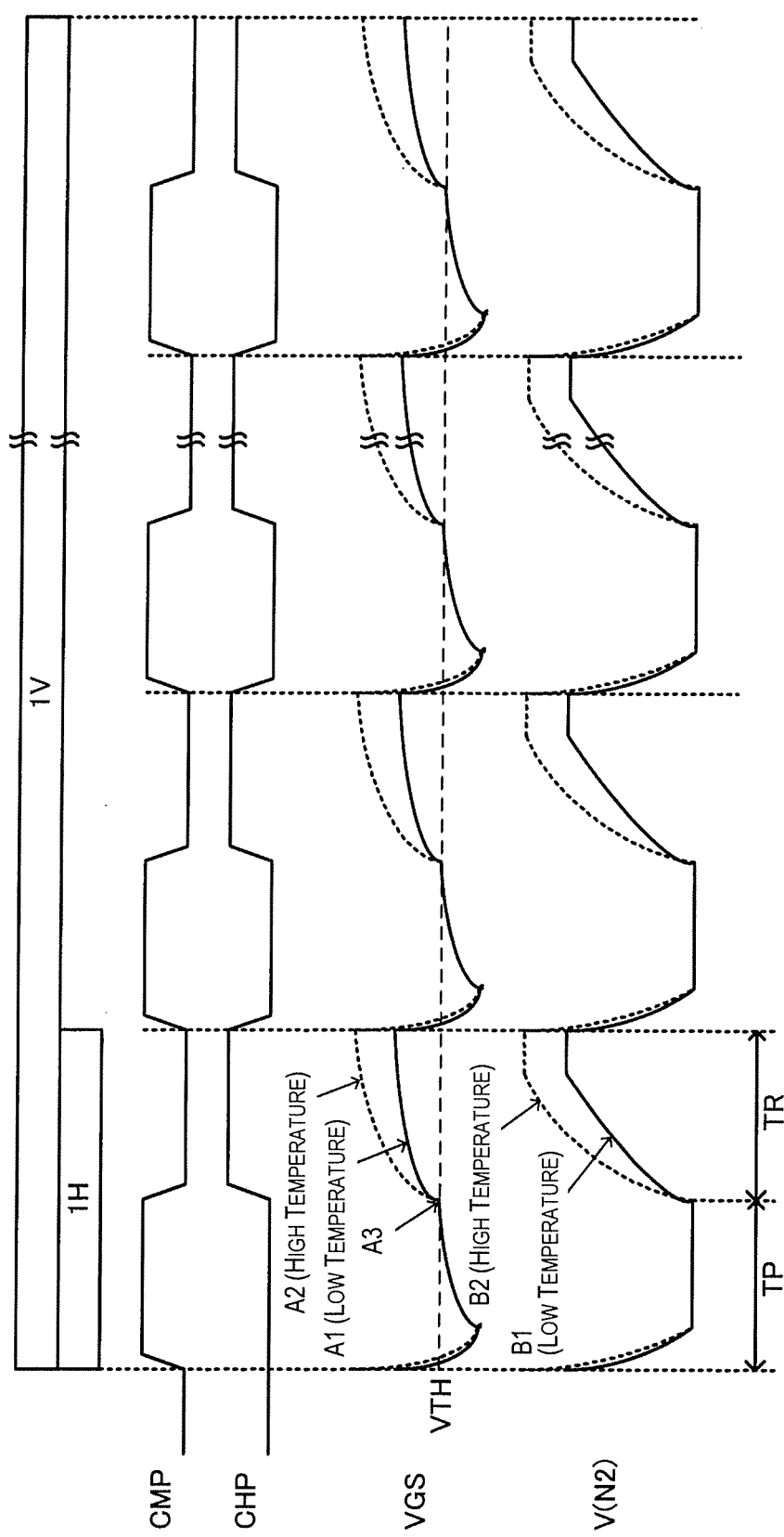
FIG. 4 is an example of the signal waveform of the first configuration example.

FIG. 4 is an example of the signal waveform of the first configuration example (FIG. 3). FIG. 4 shows the control signal CMP, a chopper signal CHP (more broadly, an incident light control signal), the voltage VGS between the gate and source of the drive transistor T1, and the voltage V (N2) of the read node N2 (output signal voltage). The chopper signal CHP is a signal that controls a chopper (more broadly, an incident light control mechanism). In an active level period infrared rays are directed at the pyroelectric element 10, and in an inactive level period the infrared rays are blocked off.

As shown in FIG. 4, in the program period TP, in a state in which the infrared rays are blocked, the voltage VGS between the gate and source of the drive transistor T1 is set (programmed) to the threshold voltage VTH of T1 (A3 in FIG. 4).

Then, in the read period TR, infrared rays are directed, a pyroelectric current is generated, and VGS changes according to the change in temperature of the pyroelectric element 10. For example, in FIG. 4, when the temperature of the object (infrared ray source) is low, VGS changes as indicated by A1. When the temperature of the object is high, VGS changes as indicated by A2. The voltage V (N2) of the read node N2 changes according to this change in VGS as indicated by B1 (when the temperature is low) or B2 (when the temperature is high).

Figure 5:
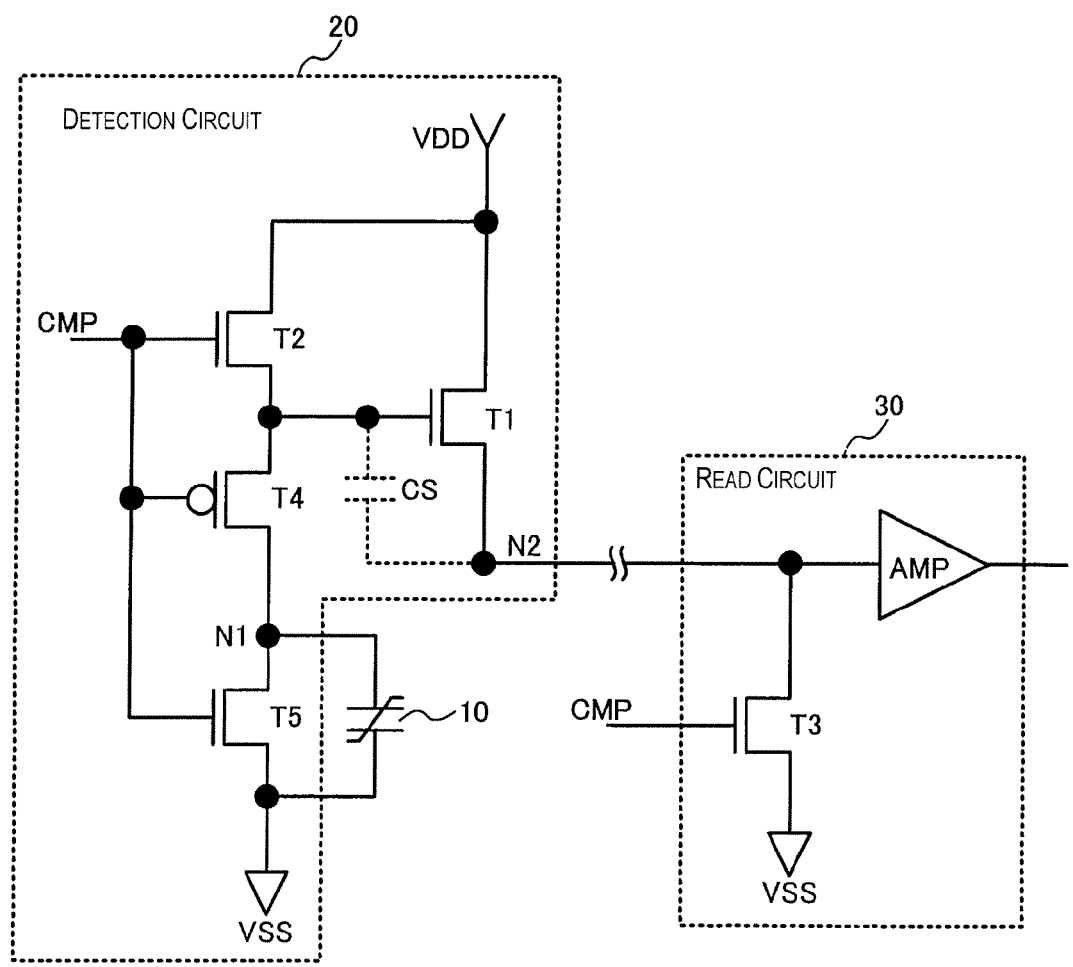
FIG. 5 is a second configuration example of a detection device.

FIG. 5 shows a second configuration example of the detection device in this embodiment. This second configuration example involves adding two more transistors T4 and T5 to the first configuration example discussed above (FIG. 3). This means that no voltage is applied to the pyroelectric element 10 in the program period TP.

In the second configuration example, the detection circuit 20 includes a P-type switching transistor T4 and an N-type resetting transistor T5. The P-type switching transistor T4 is provided between the gate of the drive transistor T1 and the detection node N1. The N-type resetting transistor T5 is provided between the detection node N1 and the low potential-side power supply node VSS (more broadly, the first power supply node).

The P-type switching transistor T4 is in its off state in the program period TP, and is in its on state in the read period TR. The N-type resetting transistor T5 is in its on state in the program period TP, and is in its off state in the read period TR. Therefore, in the program period TP, the detection node N1 is electrically connected to the low potential-side power supply node VSS, and is electrically disconnected from the gate of T1, so no voltage is applied to the pyroelectric element 10. Meanwhile, in the read period TR, N1 is electrically connected to the gate of T1, so pyroelectric current charges the parasitic capacitance CS and the voltage between the gate and source of T1 changes. This configuration makes it possible to improve the accuracy of the detection device because no voltage is applied to the pyroelectric element 10 in the program period TP. The operation of the drive transistor T1, the programming transistor T2, and the current path transistor T3 is the same as in the first configuration example, and therefore will not be described again.

Figure 6:
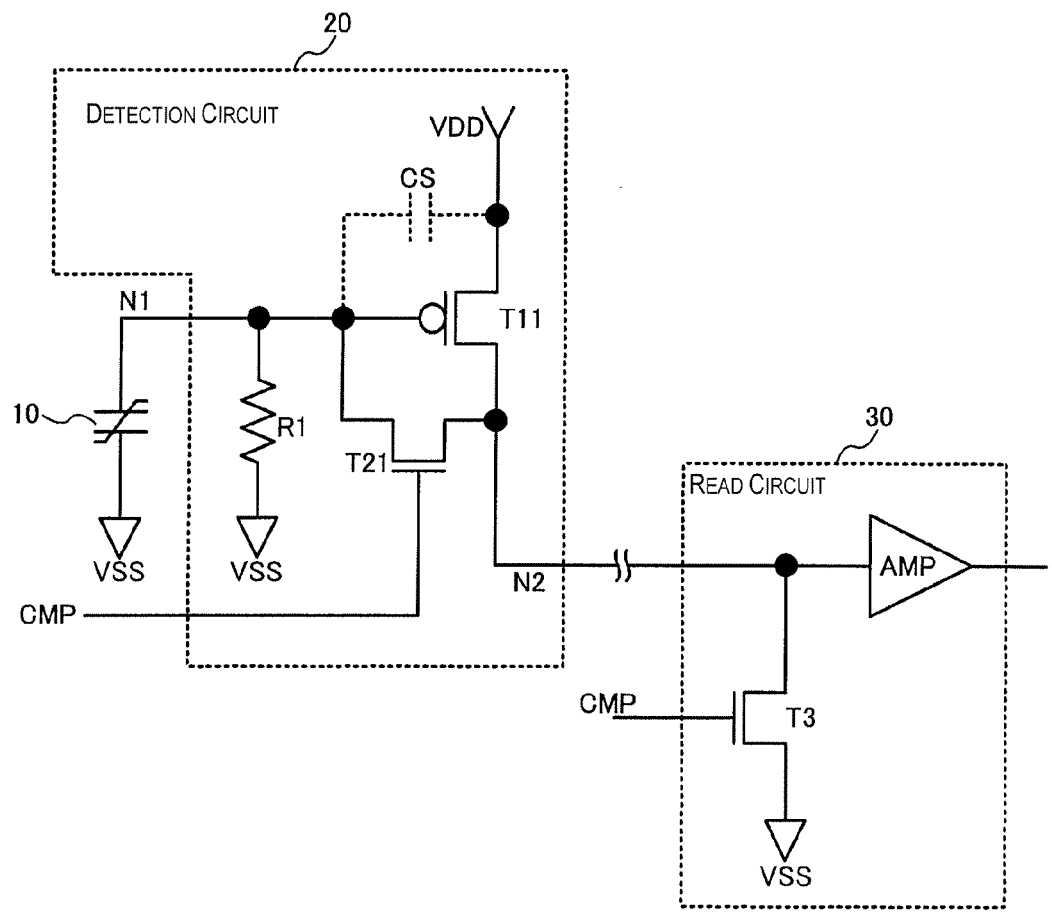
FIG. 6 is a third configuration example of a detection device.

FIG. 6 shows a third configuration example of a detection device. This third configuration example is a detection device that employs a polarization detection method. In the third configuration example, the detection circuit 20 includes a drive transistor T11, an N-type programming transistor T21, and a resistance element R1. The resistance element R1 is provided between the detection node N1 and the low potential-side power supply node VSS. The read circuit 30 is the same as in the first and second configuration examples above.

Figure 7:
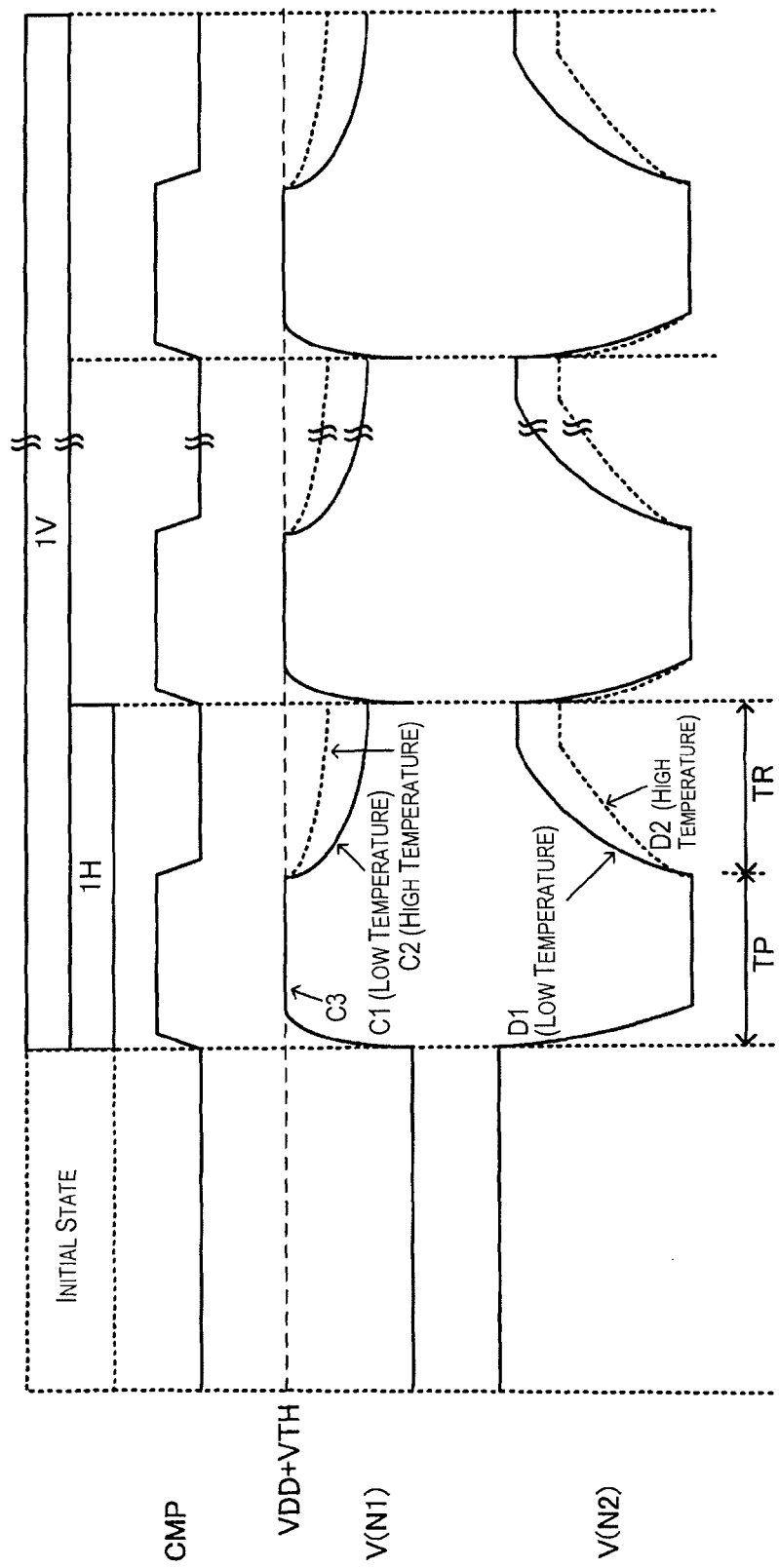
FIG. 7 is an example of the signal waveform of the third configuration example.

FIG. 7 shows an example of the signal waveform of the third configuration example (FIG. 6). The operation in the third configuration example will now be described through reference to FIG. 7.

In the initial state, the control signal CMP is at the L level (low potential level), and the N-type programming transistor T21 and the current path transistor T3 are in their off state. The detection node N1 is at the L level, so the drive transistor T11 is in its off state, and the read node N2 is at the H level (high potential level).

Then, in the program period TP, the control signal CMP is at the H level, and the N-type programming transistor T21 and the current path transistor T3 are in their on state. Since drain current flows from T11 to T3, the potential of the read node N2 is a voltage determined by the ratio of the on-resistance between T11 and T3. Meanwhile, since the potential of N2 is fed back to N1 via the T21 in its on state, the potential of the detection node N1 rises. When the potential of N1 rises and the voltage VGS between the gate and source of T11 becomes higher than the threshold voltage VTH of T11 (VTH<0), T11 enters its off state, so the potential of N1 falls. If the VGS of T11 becomes lower than VTH, T11 again enters its on state, so the potential of N1 rises. This is how the potential of N1 is ultimately set to VDD+VTH. Specifically, the voltage VGS between the gate and source of T11 is set to VTH (C3 in FIG. 7). When this voltage value is maintained by the parasitic capacitance CS between the gate and source of T11, this programs the voltage value corresponding to the threshold voltage VTH. Also, voltage is applied to the pyroelectric element 10 when the potential of the detection node N1 rises.

Then, in the read period TR, the control signal CMP goes to the L level, and T21 and T3 enter their off state. Sine voltage is no longer applied to the pyroelectric element 10, discharge current flows from the pyroelectric element 10 through the resistance element R1. This discharge lowers the potential of the detection node N1 and puts T11 in its on state, and the potential of the read node N2 rises. Because the amount of polarization varies with the temperature of the pyroelectric element 10, the rate at which the N1 voltage drops also varies, and as a result, the rate at which the N2 voltage rises will vary. For example, in FIG. 7, when the temperature is low, there is a sudden change as indicated by C1 and D1, and when the temperature is high, the change is gradual as indicated by C2 and D2. The temperature of the infrared ray source can be measured by detecting this voltage change.

Figure 8:
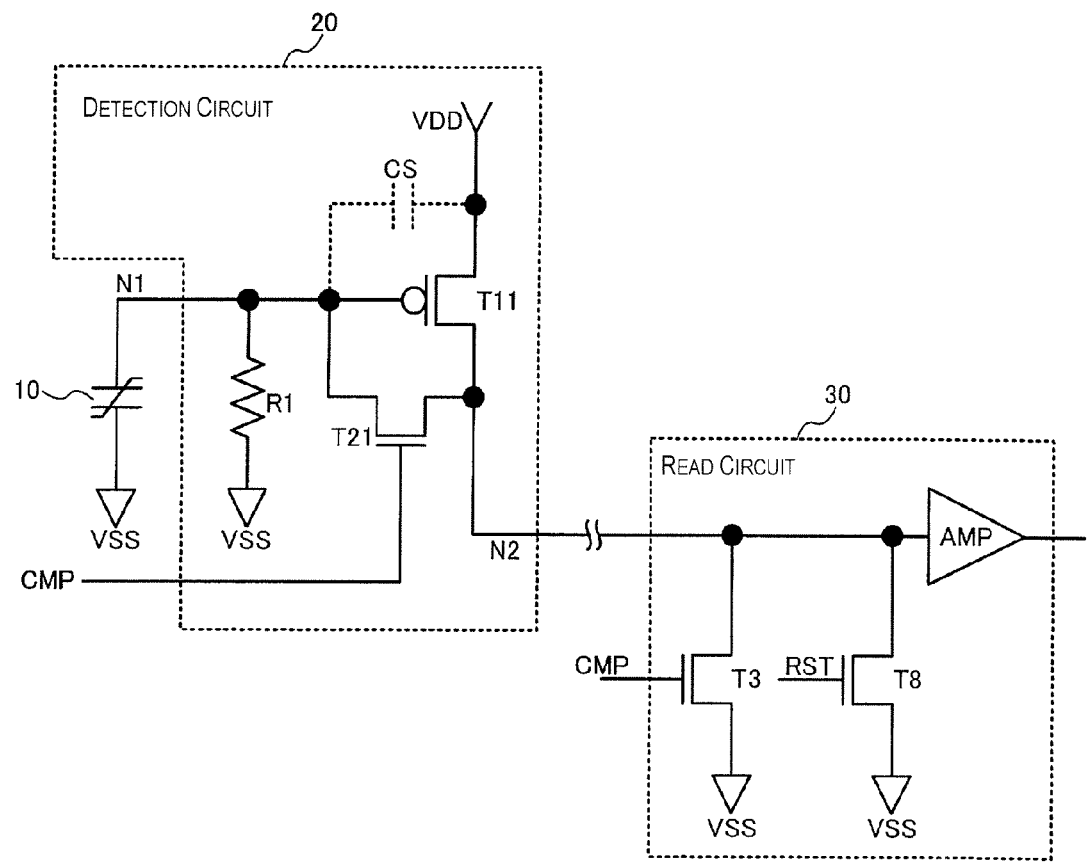
FIG. 8 is a modification of the third configuration example of a detection device.

FIG. 8 shows a modification of the third configuration example of a detection device. With the configuration in FIG. 8, the read circuit 30 further includes an output resetting transistor T8. This output resetting transistor T8 is provided between the read node N2 and the low potential-side power supply node VSS, and resets the potential of the read node N2 to the L level (low potential level) just prior to the read period TR (that is, the last part of the program period TP). As a result, there is a greater change in the voltage of the read node N2 in the read period TR, the voltage change is easier to detect, and temperature measurement accuracy can be further improved.

Figure 9:
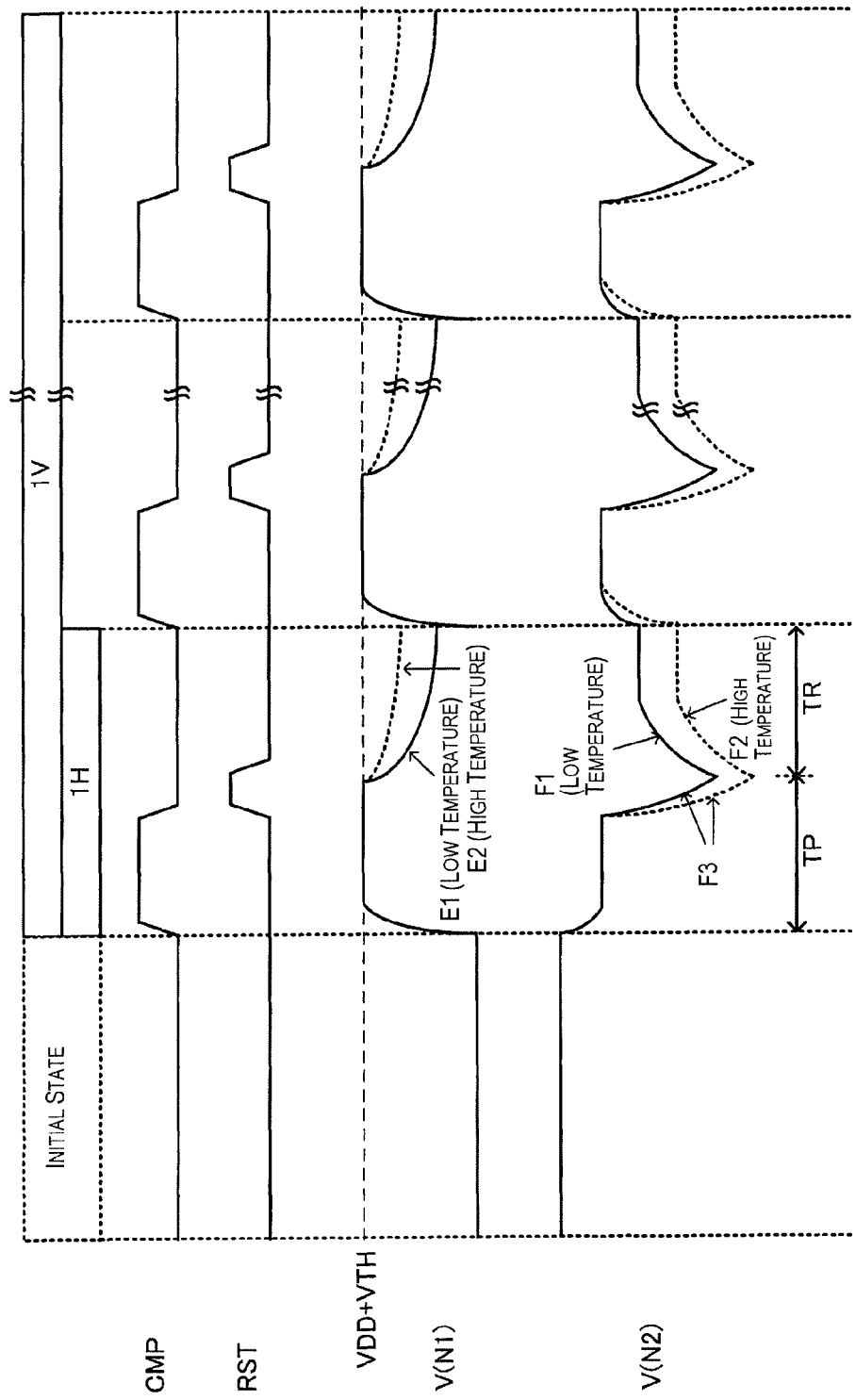
FIG. 9 is an example of the signal waveform in a modification of the third configuration example.

FIG. 9 shows an example of the signal waveform in a modification of the third configuration example (FIG. 8). The operation in the initial state and the first half of the program period TP is the same as the operation in the third configuration example shown in FIG. 7. After the potential of the detection node N1 has been set to VDD+VTH (VTH is the threshold voltage of T11, and VTH<0) in the first half of the program period TP, the control signal CMP goes to the L level, and a reset signal RST temporarily goes to the H level. When the reset signal RST goes to the H level, the output resetting transistor T8 enters its on state, so the potential of the read node N2 drops to the L level (or close to the L level) (F3 in FIG. 9).

Then, in the read period TR, as discussed above, when the potential of the detection node N1 is lowered by discharge of the pyroelectric element 10, T11 enters its on state and the potential of the read node N2 rises. For example, in FIG. 9, when the temperature is low, there is a sudden change as indicated by E1 and F1, and when the temperature is high, the change is gradual as indicated by E2 and F2. The temperature of the infrared ray source can be measured by detecting this voltage change.

Figure 10:
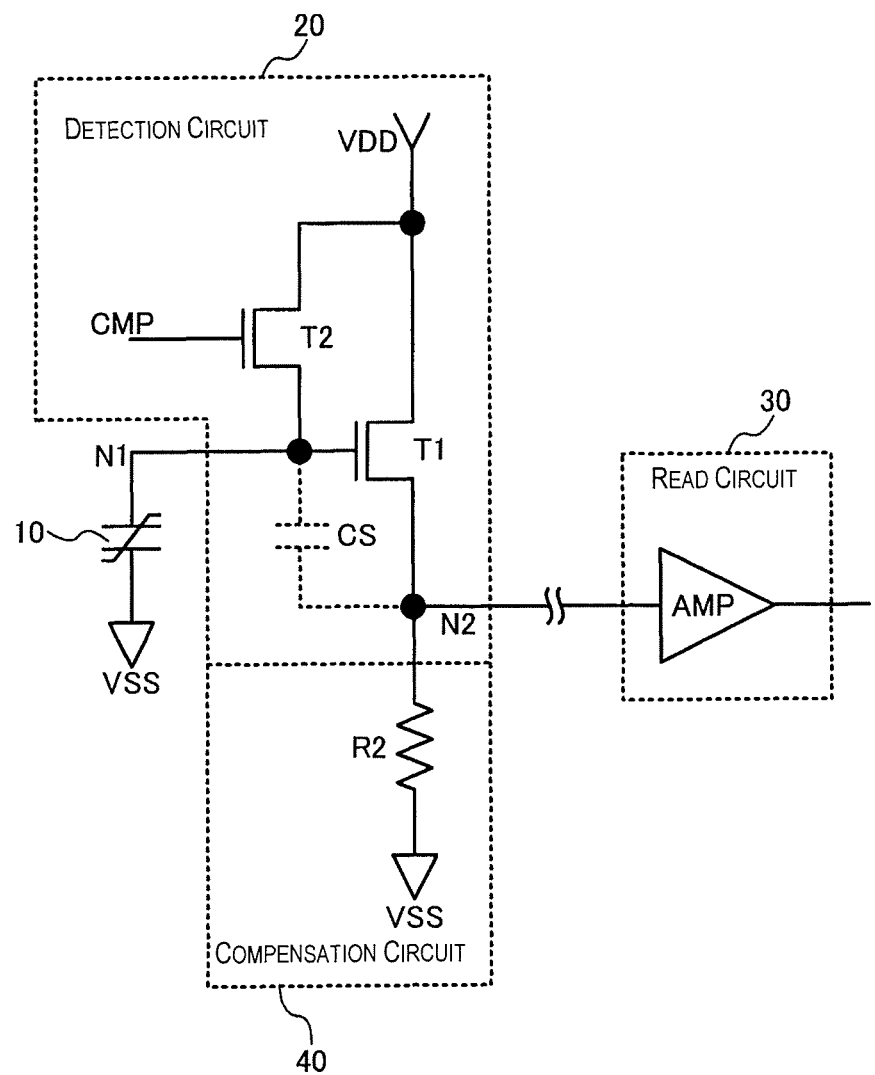
FIG. 10 is a fourth configuration example of a detection device.

FIG. 10 is a fourth configuration example of the detection device of this embodiment. The fourth configuration example is a detection device that makes use of the pyroelectric current detection method, and includes a compensation circuit 40 that compensates for variance in the current supply capability of the drive transistor T1. The compensation circuit 40 includes a resistance element R2 provided between the read node N2 and the low potential-side power supply node VSS (more broadly, the first power supply node). Providing this resistance element R2 forms a current path, so the current path transistor T3 of the read circuit 30 can be omitted.

As already described, with the detection device of this embodiment, variance can be compensated for in the threshold voltage of the drive transistor T1. However, variance in the current supply capability attributable to variance in the mobility of the drive transistor T1, variance in temperature, and so forth cannot be compensated for. With the fourth configuration example, variance in current supply capability is compensated for by providing the compensation circuit 40, so it is possible to obtain a detection device that is more accurate.

When the current supply capability of the drive transistor T1 is high, there is an increase in the current flowing through the resistance element R2. This results in a rise in the potential of the read node N2, so the variance between the drain and source of T1 decreases. A decrease in the voltage between the drain and source of T1 results in a reduction in T1 drain current.

Conversely, when the current supply capability of the drive transistor T1 is low, less current flows through the resistance element R2. This means that the potential of the read node N2 decreases, so there is a rise in the voltage between the drain and source of T1. A rise in the voltage between the drain and source of T1 results in an increase in the T1 drain current.

Thus, providing the compensation circuit 40 has the effect of eliminating the influence of variance in the current supply capability of the transistor, so variance in the current supply capability of T1 can be suppressed. As a result, a detection device can be obtained that is more accurate.

Figure 11:
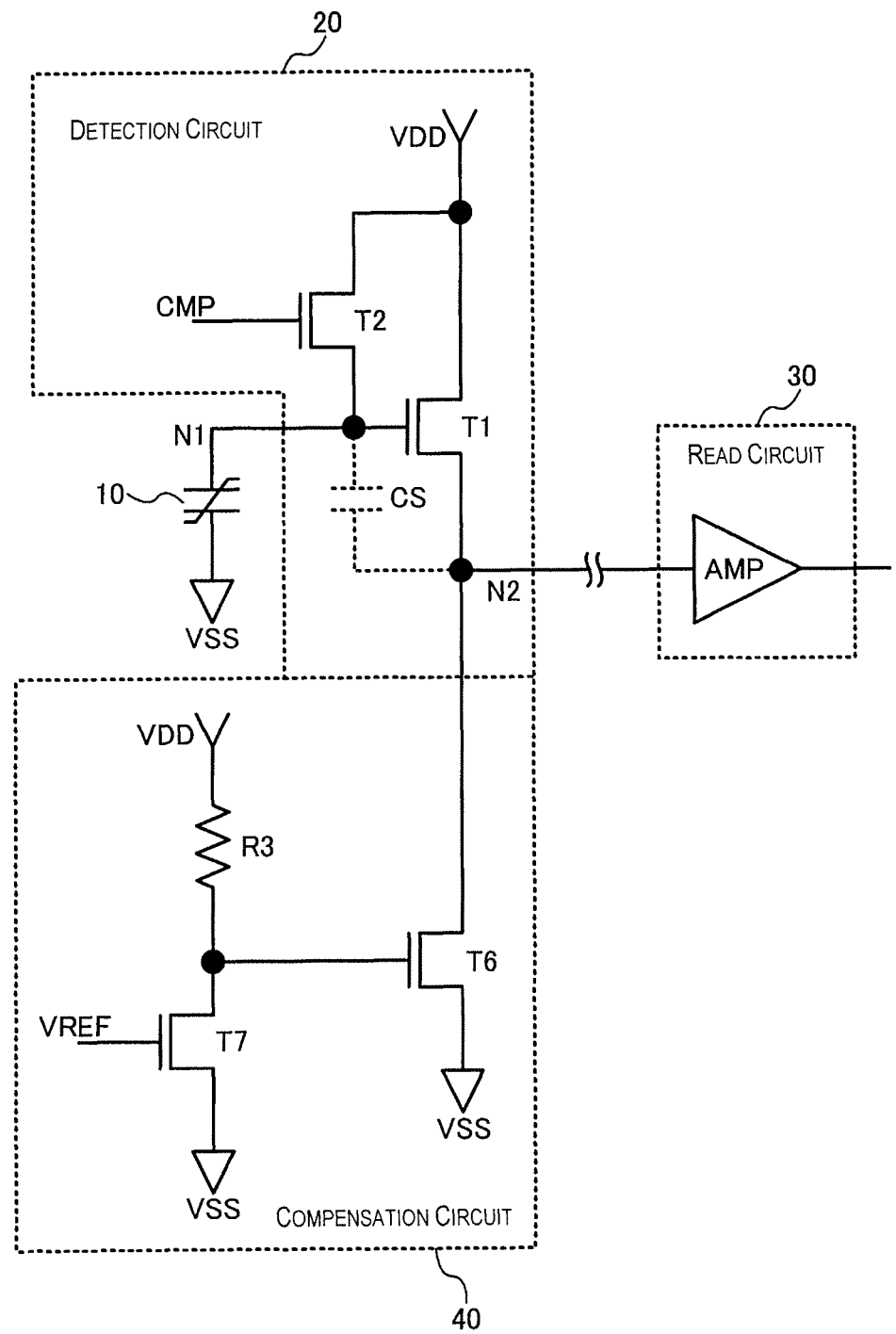
FIG. 11 is a fifth configuration example of a detection device.

FIG. 11 is a fifth configuration example of the detection device of this embodiment. This fifth configuration example is a detection device that makes use of the pyroelectric current detection method, and includes the compensation circuit 40 just as in the fourth configuration example. In the fifth configuration example, the compensation circuit 40 includes two transistors T6 and T7 and a resistance element R3. The transistor T6 is provided between the read node N2 and the low potential-side power supply node VSS (more broadly, the first power supply node). The resistance element R3 is provided between a high potential-side power supply node VDD (more broadly, the second power supply node) and the gate of T6. The transistor T7 is provided between the gate of T6 and the low potential-side power supply node VSS, and reference voltage VREF is applied to the gate of T7. Just as in the fourth configuration example, with the fifth configuration example variance in the current supply capability of the transistor is compensated for by providing the compensation circuit 40, so it is possible to obtain a detection device that is more accurate.

The current supply capability of each transistor is likewise considered have variance. For example, when the current supply capability of the drive transistor T1 varies toward the high side, the current supply capability of T7 is also higher. If the current supply capability of T7 is higher, the potential of the T7 drain, that is, the potential of the T6 gate, decreases. When the variance between the gate and source of T6 decreases, the potential of the read node N2 rises, and the voltage between the drain and source of T1 decreases. When the voltage between the drain and source of T1 decreases, the T1 drain current drops.

Conversely, when the current supply capability of a transistor varies toward the low side, the voltage between the gate and source of T6 rises, and the potential of the read node N2 decreases. As a result, the voltage between the drain and source of T1 rises, and there is an increase in the T1 drain current.

Thus, providing the compensation circuit 40 has the effect of eliminating the influence of variance in the current supply capability of the transistor, so variance in the current supply capability of T1 can be suppressed. As a result, a detection device can be obtained that is more accurate.

As described above, with the detection device of this embodiment, variance in the threshold voltage of a transistor can be compensated for, so more accurate infrared detection and so forth are possible. Furthermore, providing the compensation circuit allows compensation for current supply capability attributable to variance in the mobility of the transistor, temperature, and so froth, so detection accuracy can be further improved.

The configuration of the sensor array discussed below may be such that the compensation circuit 40 is provided to each sensor cell as in FIG. 11, or such that it is provided for every row.

3. Sensor Device

Figure 12A:
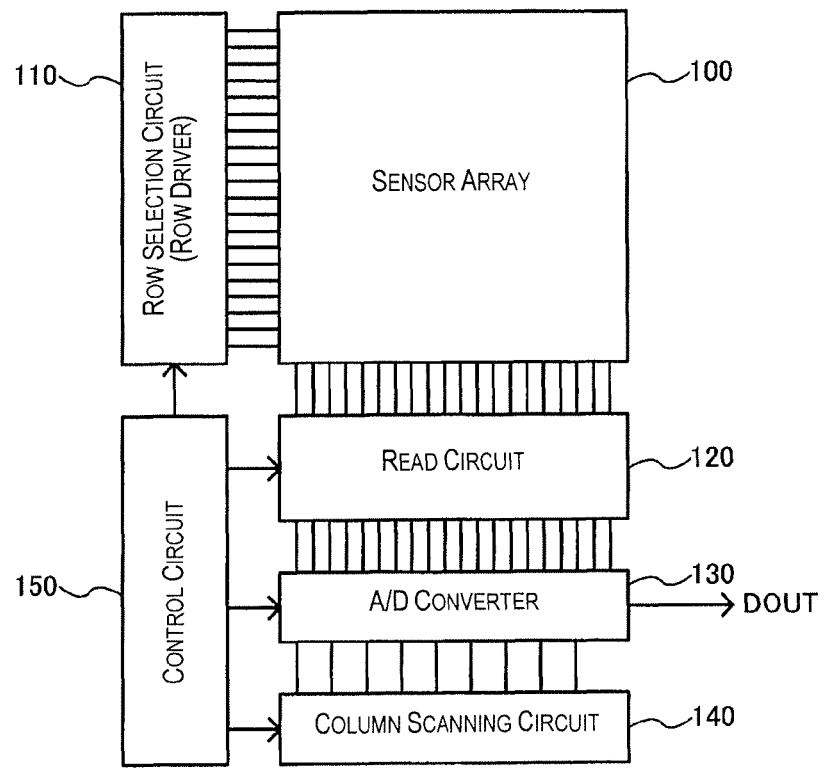
FIGS. 12A and 12B are configuration examples of a sensor device.

FIG. 12A shows a configuration example of the sensor device in this embodiment. This sensor device includes a sensor array 100, a row selection circuit (row driver) 110, and a read circuit 120. It can also include an A/D converter 130, a column scanning circuit 140, and a control circuit 150. This sensor device can be used to obtain an infrared image that is used in night vision devices or the like, for example.

A plurality of sensor cells are arranged (disposed) in the sensor array 100 (focal plane array). Also, a plurality of row lines (word lines, scanning lines) and a plurality of column lines (data lines) are provided. The number of row lines and of column lines may also be just one. For example, if there is just one row line, a plurality of sensor cells are arranged in the direction along the row line in FIG. 12A (lateral direction).

Meanwhile, if there is just one column line, a plurality of sensor cells are arranged in the direction along the column line (longitudinal direction).

Figure 12B:
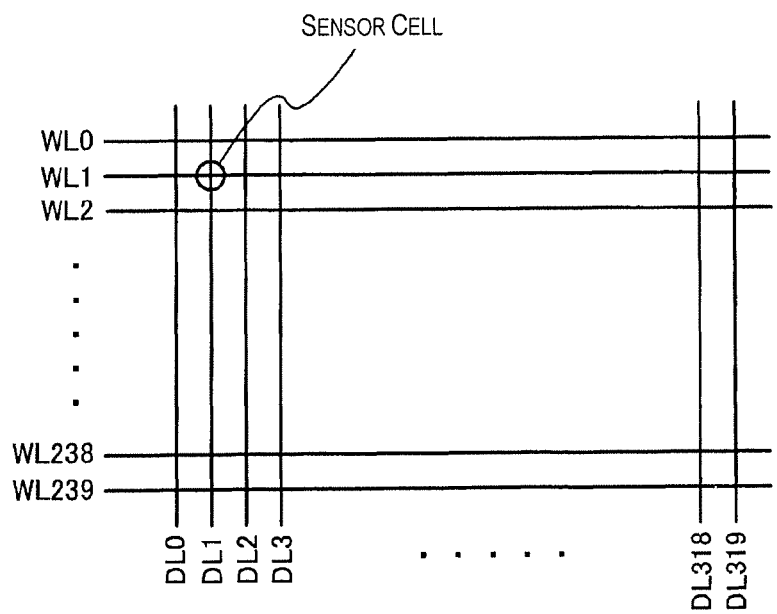

As shown in FIG. 12B, the sensor cells of the sensor array 100 are each disposed (formed) at a location corresponding to the intersection between a row line and a column line. For example, the sensor cell in FIG. 12B is disposed at a location corresponding to the intersection between a row line WL1 and a column line DL1. The same applies to the other sensor cells.

The row selection circuit 110 is connected to one or more row lines, and operates to select the row lines. For instance if we use the QVGA (320×240 pixels) sensor array 100 (focal plane array) in FIG. 12B as an example, the row lines WL0, WL1, WL2, ..., WL239 are selected (scanned) one after the other. Specifically, a signal for selecting these row lines (word selection signal) is outputted to the sensor array 100.

The read circuit 120 is connected to one or more column lines, and operates to read these column lines. If we use the QVGA sensor array 100 as an example, the operation is to read a detection signal (detected current, detected charge) from the column lines DL0, DL1, DL2, ..., DL319. This read circuit 120 can be obtained by disposing the read circuits 30 of the first to fifth configuration examples of the detection device already described, so as to correspond to the column lines.

The A/D converter 130 performs processing for the A/D conversion of detected voltage (measured voltage, maximum voltage) acquired at the read circuit 120 into digital data. The resulting digital data DOUT is then outputted. More specifically, the A/D converter 130 is provided with A/D converters corresponding to the plurality of column lines. These A/D converters perform A/D conversion on the detected voltage acquired by the read circuit 120 at the corresponding column lines. Also, just one A/D converter may be provided corresponding to a plurality of column lines, and this one A/D converter may subject the detected voltage for a plurality of column lines to A/D conversion in time series.

The column scanning circuit 140 successively selects (scans) the columns, and performs an operation for outputting the digital data that has undergone A/D conversion for each column as time series data. The digital data for each column may also be outputted in parallel, without the column scanning circuit 140 being provided.

The control circuit 150 (timing circuit) produces various kinds of control signal and outputs these to the row selection circuit 110, the read circuit 120, the A/D converter 130, and the column scanning circuit 140. For example, a control signal for charging or discharging (reset) is produced and outputted. Alternatively, a signal that controls the timing for each circuit is produced and outputted.

Figure 13:
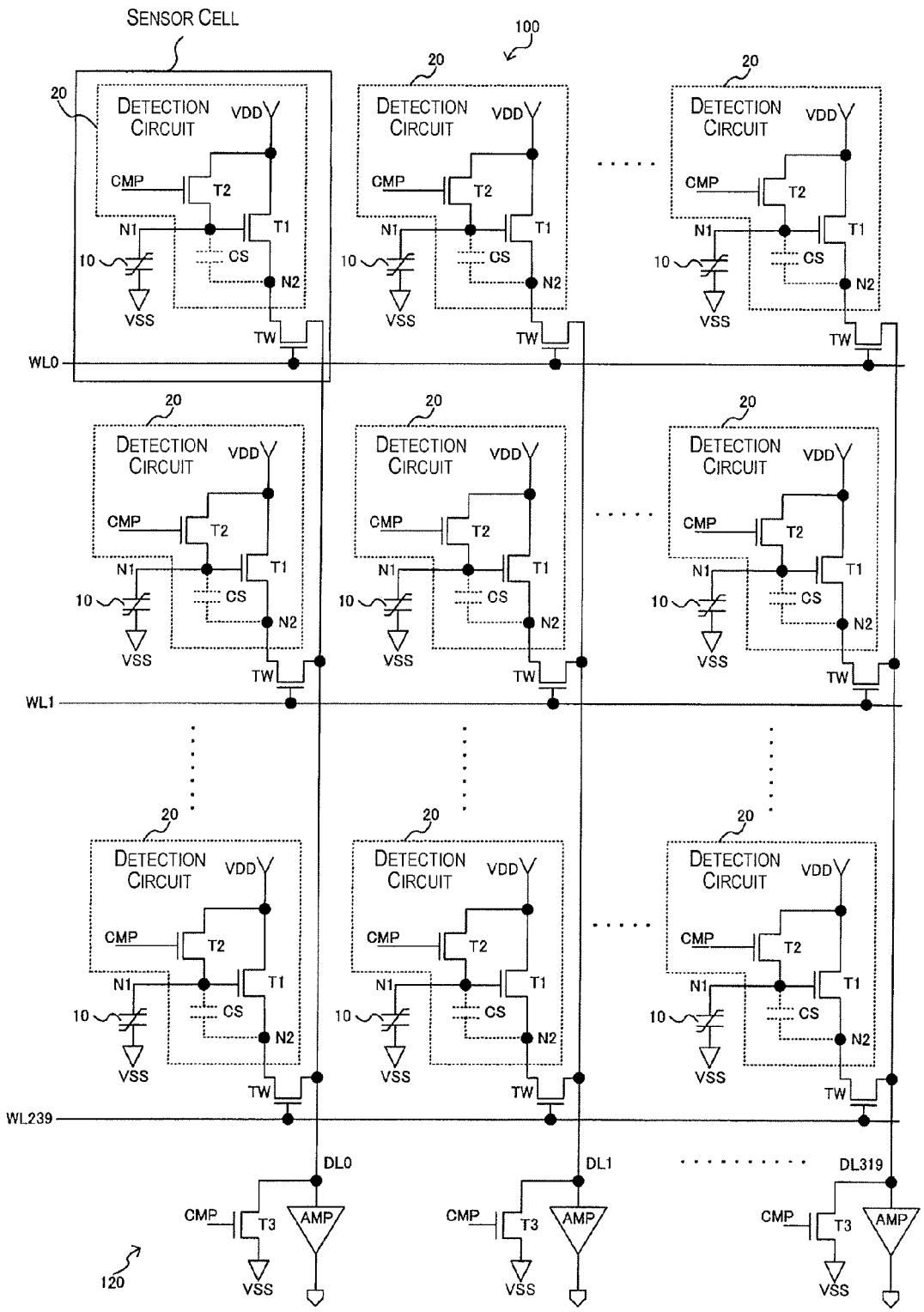
FIG. 13 is a detail configuration example of a sensor array and a read circuit.

FIG. 13 is a detail configuration example of the sensor array 100 and the read circuit 120. In FIG. 13, the first configuration example (FIG. 3) is used for the sensor cells and the read circuits, but modifications in which the various configurations and methods shown in FIGS. 5, 6, 8, 10, and 11 are combined are also possible.

Each sensor cell includes a pyroelectric element 10 (more broadly, a heat sensing element) and a detection circuit 20 that detects the voltage of the detection node N1, which is the node at one end of the pyroelectric element 10. The detection circuit 20 includes a drive transistor T1 whose gate is controlled by the detection node N1. In the program period TP, the detection node N1 is programmed to a voltage value corresponding to the threshold voltage of the drive transistor T1. In the read period TR that follows the program period TP, the read circuit 120 reads the detection result of the detection circuit connected to each of the one or more column lines DL (DL0 to CL319).

More specifically, when the row line WL0 is selected, for example, a transistor TW whose gate is connected to the row line WL0 enters its on state. The one or more sensor cells corresponding to this row line WL0 are electrically connected to the corresponding column lines DL (DL0 to DL319). At this point row lines WL other than the row line WL0 (WL1 to WL239) are not selected.

In the program period TP, the control signal CMP is at the H level (high potential level), and the programming transistor T2 of the selected sensor cell and the current path transistor T3 of the read circuit 120 are in their on state. When T2 is switched on, the potential of the detection node N1, that is, the gate of the drive transistor T1, rises. When the potential of the T1 gate rises, T1 enters its on state, and drain current flows to T1 and T3. As a result, the voltage applied to the parasitic capacitance CS between the gate and source of T1 has a value corresponding to the threshold voltage of T1, and this voltage value is maintained by the charge given to the parasitic capacitance CS. Specifically, a voltage value is programmed that corresponds to the threshold voltage of T1. In addition to the parasitic capacitance CS, a voltage maintenance capacitor may be provided between the gate and source of T1. In this program period TP, infrared rays are blocked off by the chopper, and the temperature of the pyroelectric element 10 does not change.

Meanwhile, in the read period TR the control signal CMP is at the L level (low potential level), and the programming transistor T2 and the current path transistor T3 are in their off state. In the read period TR, infrared rays are directed at the pyroelectric element 10, and as a result the temperature of the pyroelectric element 10 rises, creating pyroelectric current. This pyroelectric current charges the parasitic capacitance CS between the gate and source of T1, and the potential of the detection node N1 rises. Sine the potential of the read node N2 varies along with changes in the potential of the detection node N1, this change is amplified by an amplifier included in the read circuit 120.

Detection signals from the one or more sensor cells corresponding to the row line WL0 are thus read for every column. After this, the other row lines WL (WL1 to WL239) are successively selected, and detection signals are read from the sensor cells in the same manner as above.

As described above, since the potential of the detection node N1 in the initial state (that is, a state in which the infrared rays are being blocked) is set to a voltage value corresponding to the threshold voltage of the drive transistor T1, even if there is variance in the threshold voltage of T1, the effect of this variance can be minimized.

With a sensor array or the like, even though the temperature of the infrared source is the same, there is the risk that variance in the threshold voltage of the transistors of the sensor cells will cause variance in the signal voltage read between sensor cells. With the sensor device in this embodiment, variance in the detection signal voltage (read signal voltage) caused by variance in the threshold voltage of the transistors included in the sensor cells can be reduced. As a result, it is possible to raise the detection accuracy (resolution) of the sensor device.

As to the timing of the program period TP and the read period TR, various methods can be employed in addition to a method in which programming and reading are repeated successively for every row as discussed above. For instance, a method in which programming is performed simultaneously for all of the sensor cells prior to infrared measurement is also possible.

4. Electronic Device

Figure 14:
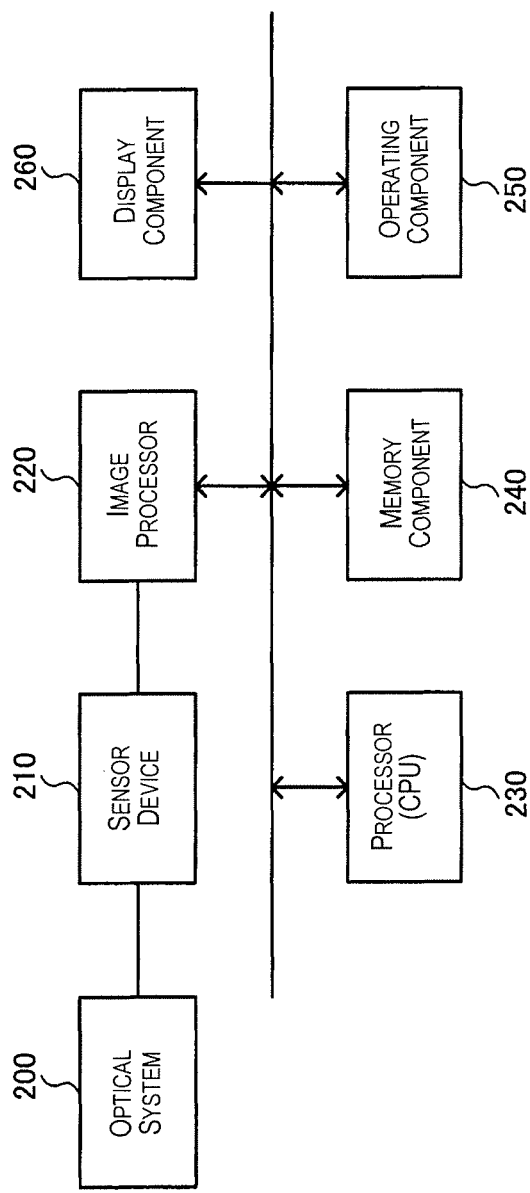
FIG. 14 is a configuration example of an electronic device.

FIG. 14 is a configuration example of an electronic device that includes the detection device or sensor device of this embodiment. This electronic device is an infrared camera, for example, and includes an optical system 200, a sensor device 210, an image processor 220, a processor 230, a memory component 240, an operating component 250, and a display component 260. The electronic device of this embodiment is not limited to the configuration shown in FIG. 14, and various modifications are possible, such as omitting some of its constituent elements (such as the optical system, the operating component, or the display component), or adding other constituent elements.

The optical system 200 includes, for example, one or more lenses, a driver for driving these lenses, and so forth. It also forms an object image on the sensor device 210, etc. If needed, it may also perform focal adjustment.

The sensor device 210 is the one described through reference to FIG. 12A, etc., and performs imaging processing of an object image. The image processor 220 performs various kinds of image processing, such as image correction processing, on the basis of digital image data (pixel data) from the sensor device 210.

The processor 230 performs overall control of the electronic device, or performs control over the various blocks in the electronic device. This processor 230 can be a CPU, for example. The memory component 240 stores various kinds of information, and functions, for example, as the working area of the image processor 220 and the processor 230. The operating component 250 serves as an interface that allows the user to control the electronic device, and comprises, for example, various buttons, a GUI (graphic user interface) screen, or the like. The display component 260 displays images acquired by the sensor device 210, GUI screens, and so forth, and can be any of various displays such as a liquid crystal display or an organic electroluminescence display.

This embodiment can be applied to various kinds of electronic device, such as night vision devices that capture object images at night, thermographic devices that acquire the temperature distribution of an object, intrusion detection devices that detect intruders, analytic devices (measurement devices) that perform analysis (measurement) of physical information about an object, security devices that detect fire or heat, factory automation devices installed in factories and the like, and so forth.

This embodiment was described in detail above, but it should be readily understood by a person skilled in the art that many modifications are possible without departing substantially from the novel features and effects of the present invention. Therefore, all, of these modifications are encompassed by the scope of the present invention. For example, in the Specification and Drawings, terms (VSS node, VDD node) that are used at least once along with terms having broader or the same definitions (first power supply node, second power supply node) can be substituted with these different terms anywhere in the Specification or Drawings. Also, the configuration and operation of the detection device, sensor device, and electronic device are not limited to those described in this embodiment, and various modifications are possible.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A detection device comprising:
   a heat sensing element;
   a detection circuit configured to detect the voltage of a detection node that is a node of one end of the heat sensing element; and
   a read circuit including an amplifier, the read circuit being connected to a read node of the detection circuit,
   the detection circuit including a drive transistor whose gate is controlled by the detection node,
   the detection circuit including a programming transistor directly connected between the detection node and the drain of the drive transistor,
   the detection circuit being configured such that, in a program period during which light rays are blocked off from the heat sensing element, the detection node is programmed to a voltage value corresponding to the threshold voltage of the drive transistor, and
   in a read period, during which light rays are incident on the heat sensing element, following the program period, the read circuit being configured to read the detection result of the detection circuit.

2. The detection device according to claim 1, wherein the programming transistor is in its on state in the program period and in its off state in the read period.

3. The detection device according to claim 1, wherein the read node is a source node of the drive transistor, and the read circuit reads the voltage of the source node of the drive transistor.

4. The detection device according to claim 1, further comprising
   a compensation circuit that is provided between the read node and a first power supply node and that compensates for variance in the current supply capability of the drive transistor.

5. The detection device according to claim 4, wherein the compensation circuit includes a resistance element or transistor that is provided between the read node and the first power supply node.

6. The detection device according to claim 1, wherein the detection circuit includes:
- a switching transistor provided between the detection node and the gate of the drive transistor, and
- a resetting transistor provided between the first power supply node and the detection node, the switching transistor being in its off state in the program period and in its on state in the read period, and the resetting transistor being in its on state in the program period and in its off state in the read period.

7. The detection device according to claim 1, wherein the read circuit includes a current path transistor provided between a first power supply node and the read node, and the current path transistor is in its on state in the program period and in its off state in the read period.

8. A sensor device comprising:
- a sensor array having a plurality of sensor cells;
- one or more row lines;
- one or more column lines;
- a row selection circuit connected to the one or more row lines; and
- a read circuit including an amplifier, the read circuit being connected to the one or more column lines, each of the plurality of sensor cells including a heat sensing element and a detection circuit configured to detect the voltage of a detection node that is a node of one end of the heat sensing element, the detection circuit including a drive transistor whose gate is controlled by the detection node, the detection circuit including a programming transistor directly connected between the detection node and the drain of the drive transistor, the detection circuit being configured such that, in a program period during which light rays are blocked off from the heat sensing element, the detection node being programmed to a voltage value corresponding to the threshold voltage of the drive transistor, and in a read period, during which light rays are incident on the heat sensing element, following the program period, the read circuit being configured to read the detection result of the detection circuit connected to each of the one or more column lines.

9. An electronic device comprising
a detection device including:
- a heat sensing element;
- a detection circuit configured to detect the voltage of a detection node that is a node of one end of the heat sensing element; and
- a read circuit including an amplifier, the read circuit being connected to a read node of the detection circuit, the detection circuit including a drive transistor whose gate is controlled by the detection node, the detection circuit including a programming transistor directly connected between the detection node and the drain of the drive transistor, the detection circuit being configured such that, in a program period during which light rays are blocked off from the heat sensing element, the detection node is programmed to a voltage value corresponding to the threshold voltage of the drive transistor, and in a read period, during which light rays are incident on the heat sensing element, following the program period, the read circuit being configured to read the detection result of the detection circuit.

10. The electronic device according to claim 9, wherein the programming transistor is in its on state in the program period and in its off state in the read period.

11. The electronic device according to claim 9, wherein the read node is a source node of the drive transistor, and the read circuit reads the voltage of the source node of the drive transistor.

12. The electronic device according to claim 9, wherein a compensation circuit that is provided between the read node and a first power supply node and that compensates for variance in the current supply capability of the drive transistor.

13. The electronic device according to claim 12, wherein the compensation circuit includes a resistance element or transistor that is provided between the read node and the first power supply node.

14. The electronic device according to claim 9, wherein the detection circuit includes:
- a switching transistor provided between the detection node and the gate of the drive transistor, and
- a resetting transistor provided between the first power supply node and the detection node, the switching transistor being in its off state in the program period and in its on state in the read period, and the resetting transistor being in its on state in the program period and in its off state in the read period.

15. The electronic device according to claim 9, wherein the read circuit includes a current path transistor provided between a first power supply node and the read node, and the current path transistor is in its on state in the program period and in its off state in the read period.

* * * * *